(12) United States Patent
Xia et al.

(10) Patent No.: US 8,723,209 B2
(45) Date of Patent: May 13, 2014

(54) OUT COUPLING LAYER CONTAINING PARTICLE POLYMER COMPOSITE

(75) Inventors: Chuanjun Xia, Lawrenceville, NJ (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 87 days.

(21) Appl. No.: 13/586,724

(22) Filed: Aug. 15, 2012

(65) Prior Publication Data

US 2013/0285088 A1   Oct. 31, 2013

Related U.S. Application Data

(60) Provisional application No. 61/639,439, filed on Apr. 27, 2012.

(51) Int. Cl.
*H01L 33/00* (2010.01)

(52) U.S. Cl.
USPC ......... 257/98; 257/E51.001; 438/29; 977/890

(58) Field of Classification Search
USPC ......................... 977/890–901; 438/480–490; 257/E51.001
See application file for complete search history.

(56) References Cited

U.S. PATENT DOCUMENTS

| | | |
|---|---|---|
| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Kim, et. al, Antibofouling Polymer-Coated Gold Nanoparticles as a Contrast Agent for in Vivo X-ray Computed Tomography Imaging, 2007.*

(Continued)

*Primary Examiner* — Julio J Maldonado
*Assistant Examiner* — Robert Bachner
(74) *Attorney, Agent, or Firm* — Sterne, Kessler, Goldstein & Fox P.L.L.C.

(57) ABSTRACT

Light emitting devices comprising an optical layer comprising metal oxide particles having a polymer covalently bonded thereto and a light emitting layer, which is in optical communication with the optical layer are provided. Methods of fabricating a light emitting devices comprising: depositing an optical layer comprising metal oxide particles having a polymer covalently bonded thereto; and depositing a light emitting layer, which is in optical communication with the optical layer are also provided.

17 Claims, 6 Drawing Sheets

(56) References Cited

U.S. PATENT DOCUMENTS

| | | | |
|---|---|---|---|
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 7,851,995 | B2 | 12/2010 | Tyan et al. |
| 7,957,621 | B2 | 6/2011 | Zhang et al. |
| 7,968,146 | B2 | 6/2011 | Wagner et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2009/0243477 | A1 | 10/2009 | Saneto et al. |
| 2010/0117503 | A1* | 5/2010 | Mizuno et al. ............... 313/110 |
| 2010/0225229 | A1 | 9/2010 | Hosoda et al. |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 10/2009 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008/057394 | 5/2008 |
| WO | WO 2008056746 | 5/2008 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |
| WO | WO 2010/011390 | 1/2010 |

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Tung, Yung-Liang et al., "Organic Light-Emitting Diodes Based on Charge-Neutral Ru$^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Wong, Wai-Yeung, "Multifunctional Iridium Complexes Based on Carbazole Modules as Highly Efficient Electrophosphors," Angew. Chem. Int. Ed., 45:7800-7803 (2006).

Tang, C.W. and VanSlyke, S.A., "Organic Electroluminescent Diodes," Appl. Phys. Lett., 51(12):913-915 (1987).

Adachi, Chihaya et al., "Organic Electroluminescent Device Having a Hole Conductor as an Emitting Layer," Appl. Phys. Lett., 55(15):1489-1491 (1989).

MA, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Gao, Zhiqiang et al., "Bright-Blue Electroluminescence From a Silyl-Substituted ter-(phenylene-vinylene) derivative," Appl. Phys. Lett., 74(6):865-867 (1999).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

(56) References Cited

OTHER PUBLICATIONS

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic LIght-Emitting Diodes with Phosphorescent Platinum Complexes Containing NCN-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emiting Devices with Tunable Colour, *Chem. Commun.*, 2906-2908 (2005).

Hamada,Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).

Sakamoto,Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15 ):2160-2162 (1996).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

Baldo et al., "Highly Efficient Phosphorescent Emission from Organic Electroluminescent Devices," *Nature*, vol. 395, 151-154, (1998).

Baldo et al., "Very high-efficiency green organic light-emitting devices based on electrophosphorescence," Appl. Phys. Lett., vol. 75, No. 3, 4-6 (1999).

Wang et al.,"A Facile Strategy to Modify TiO2 Nanoparticies via Surface-Initiated ATRP of Styrene" Journal of Polymer Science: Part A: Polymer Chemistry, vol. 48, 1782-1790 (2010).

Chang et al., "Fourfold power efficiency improvement in organic light-emitting devices using an embedded nanocomposite scattering layer" Organic Electronics 13 (2012) 1073-1080.

U.S. Appl. No. 61/639,439, filed Apr. 27, 2012.

\* cited by examiner

OUT COUPLING LAYER CONTAINING PARTICLE POLYMER COMPOSITE

The present application claims the benefit of priority to U.S. Provisional Patent Application No. 61/639,439, filed Apr. 27, 2012, which is incorporated by reference in its entirety as though fully set forth herein.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). In particular, the invention relates to a polymer composite layer that may have increased stability when used as a scattering layer in an OLED and which thereby improves light out coupling.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

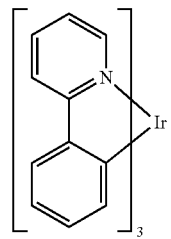

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A new type of light emitting device and methods of its fabrication are provided, where the light emitting device includes an optical layer that comprises metal oxide particles having a polymer covalently bonded to the particle surface.

In some embodiments, the invention provides a method of fabricating a light emitting device, comprising: depositing an optical layer comprising metal oxide particles having a polymer covalently bonded thereto; and depositing a light emitting layer, which is in optical communication with the optical layer. In some embodiments, the optical layer comprises a scattering layer. In some such embodiments, the scattering layer comprises scattering centers dispersed in a polymer matrix. In some such embodiments, the scattering centers comprise metal oxide particles.

The aforementioned metal oxide particles can be selected from any suitable metal oxides. In some embodiments, the metal oxide particles are selected from the group consisting of indium tin oxide (ITO), $SnO_2$, $Sb_2O_3$, $TiO_2$, $ZrO_2$, $Ta_2O_5$, $HfO_2$, $Nb_2O_3$, MgO, ZnO, and $In_2O_3$. In some further embodiments, the metal oxide particles are selected from the group consisting of $TiO_2$, $ZrO_2$, and $SnO_2$. In some embodiments, the metal oxide particles are $TiO_2$.

For embodiments where the optical layer comprises a scattering layer, the polymer matrix and the scattering centers can have any suitable index of refraction, as long as they are different. In some embodiments, the difference in refractive indices between the polymer matrix and the scattering centers is greater than 0.1. In some further embodiments, the difference is greater than 0.3.

The scattering centers can have any suitable particle size, as long as the size is sufficient to scatter the emitted light. In some embodiments, the scattering centers have a particle size that ranges from $\lambda_{min}/4n$ to $4*\lambda_{max}/n$, wherein $\lambda_{min}$ is the minimum wavelength of light emitted by the light emitting layer, $\lambda_{max}$ is the maximum wavelength of light emitted by the light emitting layer, and n is the index of refraction of the optical layer. In some embodiments, the scattering centers have an average particle size of greater than 50 nm. In some embodiments, the scattering centers have an average particle size of less than 3000 nm.

In some embodiments, the optical layer includes metal oxide particles having an average particle size of less than 50 nm. In some such embodiments, the optical layer, including the scattering layer, comprises scattering centers having an average particle size of greater than 50 nm and metal oxide particles having an average particle size of less than 50 nm.

The optical layer can be deposited in any suitable manner. In some embodiments, the optical layer is deposited from a solution comprising: metal oxide particles having a polymer covalently bonded thereto, and a solvent in which the polymer is soluble. Any suitable deposition method may be used. In some embodiments, the optical layer is deposited via spin-coating, ink jet printing, knife-over-edge coating, slot-die coating, screen printing, or spray-coating.

The aforementioned embodiments include metal oxide particles having a polymer covalently bonded to the surface of the particle. The covalent attachment of the polymer to the metal oxide particle can be accomplished by any suitable means. In some embodiments, the metal oxide particles having a polymer covalently bonded thereto are formed by: covalently bonding an initiator to the metal oxide particles to form an initiator bound metal oxide particles; reacting the initiator bound metal oxide particles in solution with monomers, wherein the reaction is initiated by the initiator that is bound to the metal oxide particles. In some such embodiments, the initiator comprises an anchor group that that reacts with the metal oxide surface. In some such embodiments, the anchor group is selected from the group consisting of alkoxysilanes, chlorosilanes, catacols, and carboxylic acids. In some embodiments, the initiator comprises an initiating group that can function as a free radical polymerization initiator, a photo polymerization initiator, a cationic polymerization initiator, or an anionic polymerization initiator. In other embodiments, the initiator is selected from the group consisting of an azo compound, an organic peroxide, a bromoisobutyrate compound, a nitroxide compound, a benzodithiolate compound, an acetophenone, a benzil compound, a benzion compound, a benzophenone compound, and a thioxanthone. Any suitable monomers can be used in such embodiments. In some embodiments, the monomers are selected from the group consisting of ethylene, vinyl chloride, styrene, acrylonitrile, acrylate, methyl methacrylate, vinyl acetate, and derivatives thereof.

Alternative means of attaching the polymer to the metal oxide particle can be used. In some embodiments, the metal oxide particles having a polymer covalently bonded thereto are formed by: forming polymers that comprise reactive groups; and reacting the polymers in solution with the metal oxide particles, wherein the metal oxide particles have organic compounds bound to their surface and the reactive groups of the polymers react with the organic compounds to covalently bind the polymers to the metal oxide particles. In some embodiments, the reaction between the polymer and the organic compound comprises the use of click chemistry. Any suitable polymer can be used. In some embodiments, the polymer is selected from the group consisting of polystyenes, polyarylates, polymethacrylates, polyesters, polyamides, polycarbonates, and polyurethanes.

Other alternative means of attaching the polymer to the metal oxide particle can be used. In some embodiments, the metal oxide particles having a polymer covalently bonded thereto are formed by: reacting the metal oxide particles in solution with polymers, where the polymers comprise a reactive group that reacts with the metal oxide surface to bind the polymers to the metal oxide particles. Any suitable reactive group can be employed. In some embodiments, the reactive groups are selected from the group consisting of chlorosilanes, alkoxysilanes, catacols, and carboxylic acids. Also, any suitable polymer can be employed. In some embodiments, the polymer is selected from the group consisting of polystyenes, polyarylates, polymethacrylates, polyesters, polyamides, polycarbonates, and polyurethanes.

The invention is not limited to any particular light emitting device. In some embodiments, the light emitting device is an organic light emitting device. In some embodiments, the light emitting device comprises the following layers deposited in order over a substrate: an optical layer; a first electrode; a light emitting layer comprising a small molecule (e.g., having a molecular weight up to 2500 Da) light emitting material; and a second electrode; wherein the first electrode is at least partially transparent. In some embodiments, the small molecule is an organometallic complex. In such embodiments, the device can comprise other layers. For example, in some embodiments, the light emitting device further comprises a planarization layer deposited after depositing the optical layer and before depositing the first electrode. In some embodiments, a barrier layer is deposited after depositing the second electrode and before depositing the optical layer. In some other embodiments, the first electrode is deposited directly on the optical layer.

In embodiments that include a planarization layer, the optical layer and the planarization layer can have any suitable refractive indices. In some embodiments, the optical layer and the planarization layer have refractive indices that are substantially the same. For example, in some embodiments, the refractive index of the optical layer is within 5%, or within 10%, or within 15%, of the refractive index of the planarization layer.

The planarization can have any suitable structure. In some embodiments, the planarization layer comprises a composite that includes a polymer and particles. In such embodiments, the polymer and the particle can have any suitable optical features. In some embodiments, the planarization layer is composed of: a polymer having a first refractive index and a first volume share; and particles having a second refractive index and a second volume share; and wherein the refractive index of the planarization layer is within 10% of the sum of the first refractive index multiplied by the first volume share and the second refractive index multiplied by the second volume share. In some other embodiments, the planarization layer is composed of: a polymer having a first refractive index, a first weight share, a first density, wherein a first ratio is defined by the first weight share divided by the first density; and particles having a second refractive index, a second weight share, a second density, wherein a second ratio is defined by the second weight share divided by the second density; wherein the refractive index of the planarization layer multiplied by the sum of the first ratio and the second ratio is within 10% of the sum of the first refractive index multiplied by the first ratio and the second refractive index multiplied by the second ratio.

The planarization layer can be made of any suitable materials, including composite materials, such as polymeric composites. In some embodiments, the optical layer consists essentially of a first material, and the planarization layer consists essentially of the first material. In some such embodiments, the first material is a polymeric composite, for example, that includes a polymer matrix and particles, such as metal oxide particles. In embodiments where the optical layer and the planarization layer both include particles, the particles can have any suitable size or size distribution. In some such embodiments, the optical layer comprises a first set of particles; and the planarization layer comprises a second set of particles; wherein the average particle size of the first set of particles is greater than 50 nm, and the average particle size of the second set of particles is less than 50 nm.

Alternative embodiments of light emitting devices are also included. For example, in some embodiments, the light emitting device includes the following layers deposited in order over a substrate: a first electrode; a light emitting layer comprising a small molecule light emitting material; and a second electrode; and an optical layer; wherein the second electrode is at least partially transparent. Such light emitting devices can include further layers.

In light emitting devices of the invention, the optical layer can be deposited by any suitable means. In some embodiments, depositing the optical layer comprises: depositing a first sublayer having metal oxide particles having a first average volume concentration ratio of the metal oxide particles; and depositing a second sublayer having metal oxide particles having a second average volume concentration ratio of the metal oxide particles; and wherein the first average volume concentration ratio and the second average volume concentration ratio are different. In some other embodiments, depositing the optical layer comprises: depositing a first sublayer having metal oxide particles having a first average particle size and polymer chains having a first average polymer length; and depositing a second sublayer having metal oxide particles having a second average particle size and polymer chains having a second average polymer length; and wherein at least one of the following is different: the first average particle size and the second average particle size; or the first average polymer length and the second average polymer length. In some even further embodiments, depositing the optical layer comprises: depositing a first sublayer having metal oxide particles having a first average particle size and polymer chains having a first average polymer length; and depositing a second sublayer having metal oxide particles having a second average particle size and polymer chains having a second average polymer length; and depositing a third sublayer having metal oxide particles having a third average particle size and polymer chains having a third average polymer length; wherein each sublayer has at least one of an average particle size or an average polymer length that is different from that of its adjacent sublayers. In some such embodiments, the first sublayer has an average particle size of 300 nm, the second sublayer has an average particle size of 250 nm, and the third sublayer has an average particle size of 200 nm.

In some alternative embodiments, the light emitting device comprises an optical layer comprising metal oxide particles having a polymer covalently bonded thereto; and a light emitting layer, which is in optical communication with the optical layer. In some such embodiments, the optical layer comprises a first sublayer, a second sublayer, and a third sublayer, wherein each of the sublayers has a refractive index that is different from that of its adjacent sublayers.

In some further alternative embodiments, the invention includes a light emitting device fabricated by the process of: depositing an optical layer comprising metal oxide particles having a polymer covalently bonded thereto; and depositing a light emitting layer, which is in optical communication with the optical layer.

Further embodiments and aspects of the invention are described in detail below.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
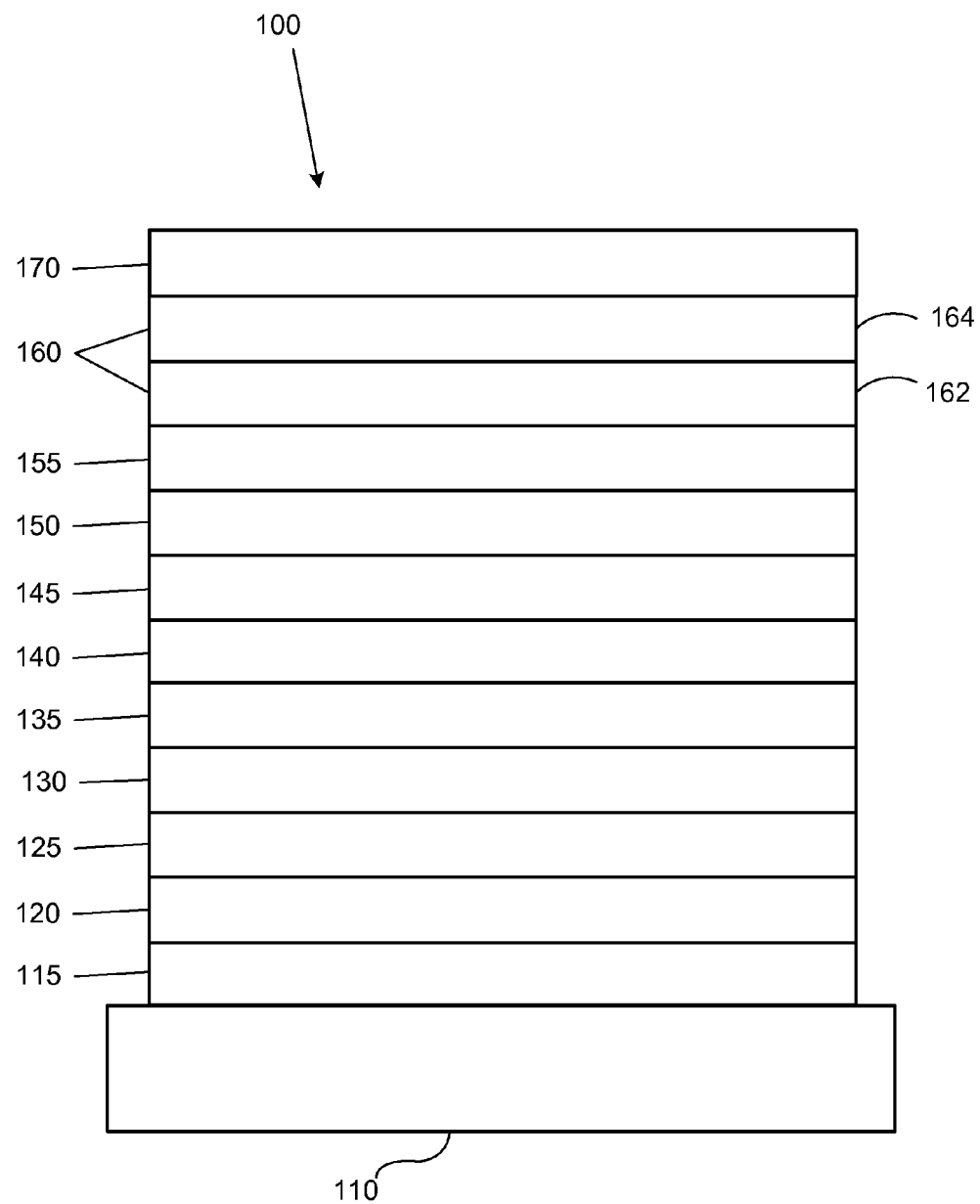
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
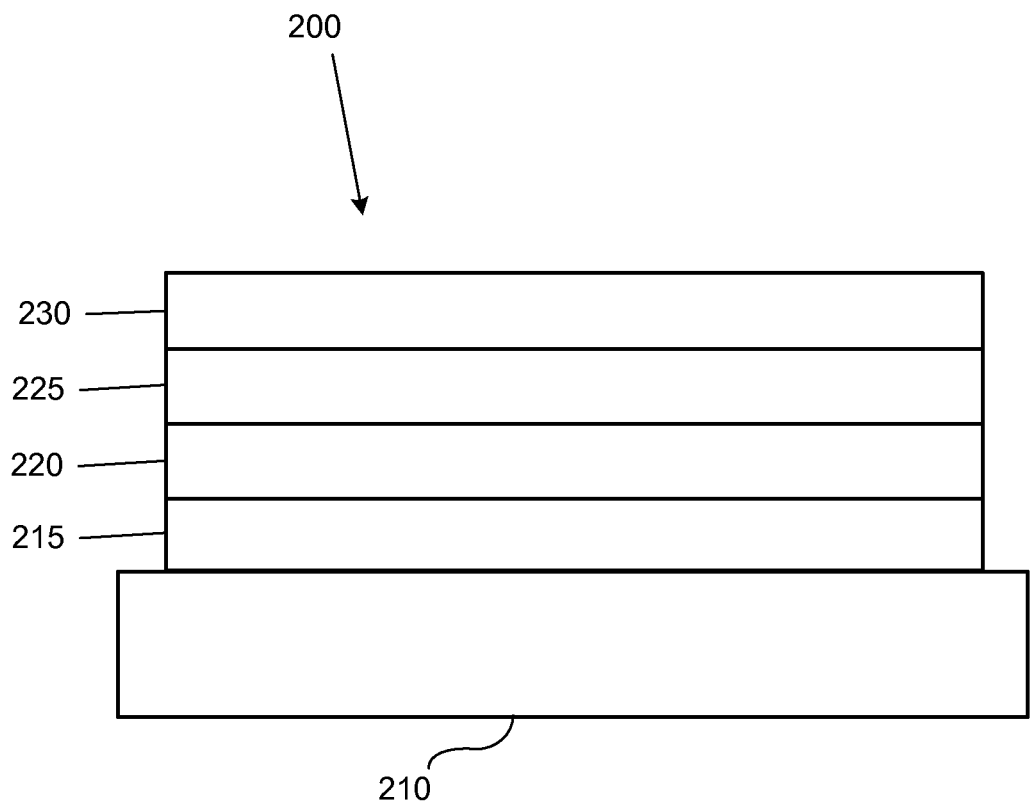
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Optical layers can employ layers that comprise physical mixtures (e.g., suspensions) of oxide particles in a polymer. Such materials suffer from several disadvantages, including instability of the resulting suspension and a lack of reproducibility when used to coat surfaces having a large area. By covalently bonding the polymer to the oxide particles, such shortcomings can be overcome, thereby yielding materials that are suitable for use in light scattering layers for out coupling in an OLED.

To improve light extraction from an OLED, a light scattering layer can be inserted into different positions in the device to extract the "waveguide mode" that is trapped in the substrate by total reflection at the substrate-air interface.

U.S. Pat. No. 7,851,995 describes one approach to extracting anode/organic waveguided light. An internal extraction layer (IEL) is employed. This structure is highly complex, consisting of three different materials: a scattering layer, a secure layer, and a high index smoothing layer. A scattering layer is also described. The scattering layer is formed by disposing a monolayer of scattering particles on a substrate followed by a securing material. The scattering layer with the securing material is then separated from the substrate to expose the scattering layer.

Scattering layers can also be formed by using a high refractive index metal oxide particles, such as $TiO_2$, and a low refractive index binder, such as a polymer. The $TiO_2$ particles can be physically dispersed in a solvent with other polymeric materials or additives. Because the surface of the $TiO_2$ particles is charged, the particles are not highly compatible with organic solvents, which makes it difficult to make a uniformly dispersed suspension. Thus, it is difficult to form uniform thin films across a large area from such heterogeneous suspensions. In addition, $TiO_2$ particles form aggregates in the solvent, which makes it difficult to control the size distribution of particles. This can degrade the film quality, resulting in poor out coupling enhancement.

In at least one aspect, the invention provides a method of fabricating uniformly distributed titanium oxide films, which overcomes the disadvantages of other methods, such as those described above. Such methods can provide a stable coating solution and provide for control of the particle sizes and the spacing between the particles in the solution, which can allow for optimum outcoupling enhancement.

Figure 3:
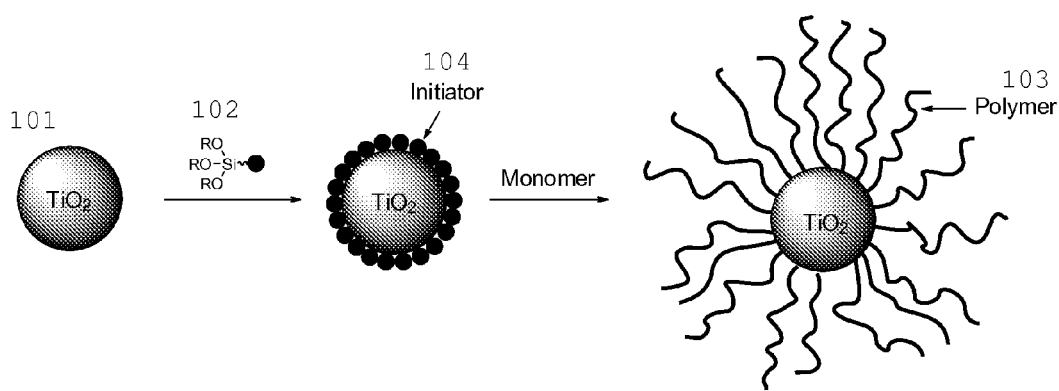
FIG. 3 shows an illustration of a process for making a metal oxide particle having polymer chains covalently bonded to the particle surface.

Certain chemical groups, such as alkoxysilanes or chlorosilanes, can couple to the surface of a titanium oxide particle. These compounds can be modified to include an initiator group that can initiate radical or ionic polymerization. As shown in FIG. 3, a silane compound that includes an initiator group 102 is bound to the surface of a titanium oxide particle 101 via covalent bonding. Such initiator-coated particles are then dispersed in a solvent in the presence of a monomer. Under certain polymerization conditions, polymer chains 103 can grow from the particle surface as the initiator 104 reacts with the monomer to start chain growth. The chain length of the polymer can be controlled by modifying the reaction conditions. Depending on the monomer choice, different refractive indices can be achieved for the polymer. Following surface-initiated polymerization, the titanium oxide particles are surrounded by polymer chains, which causes the particles to be generally soluble in those solvents in which the polymer is soluble, allowing the composite to be processed from solution alone or with other additives. Excellent film formation properties can be achieved. Depending on the chain length of the polymer, the spacing between the titanium oxide particles can be adjusted. In addition, the modified particles will resist aggregation. Different wavelengths of light can require different particles of different sizes to achieve optimum scattering results. This process allows one to control particle size, such that a scattering layer containing such particles can be tuned to properties of the emitted light.

Figure 4:
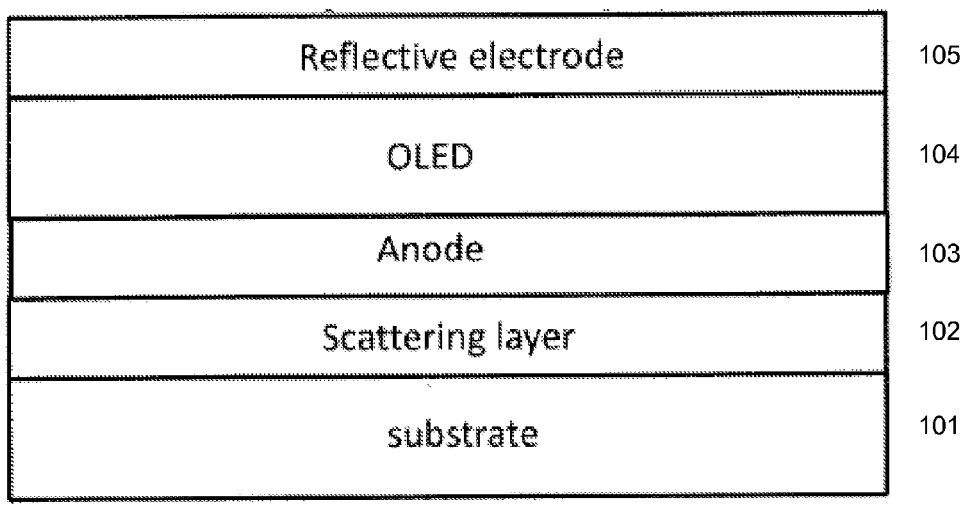
FIG. 4 shows an example OLED device having a scattering layer according to certain embodiments of the invention.

Further, in contrast to the complex coating processes described in U.S. Pat. No. 7,851,995, the above material can be easily disposed onto a surface by simple processes, such as spin coating. FIG. 4 shows a configuration of an OLED 100 using the material described above. The device can be made by (a) producing the scattering material in solution, (b) coating the solution on the substrate 101 and curing to form a scattering layer 102 on the substrate 101, and (c) building the OLED device on top of the scattering layer, where the OLED device includes an anode 103, a light emitting structure 104, and a reflective electrode 105.

Figure 5:
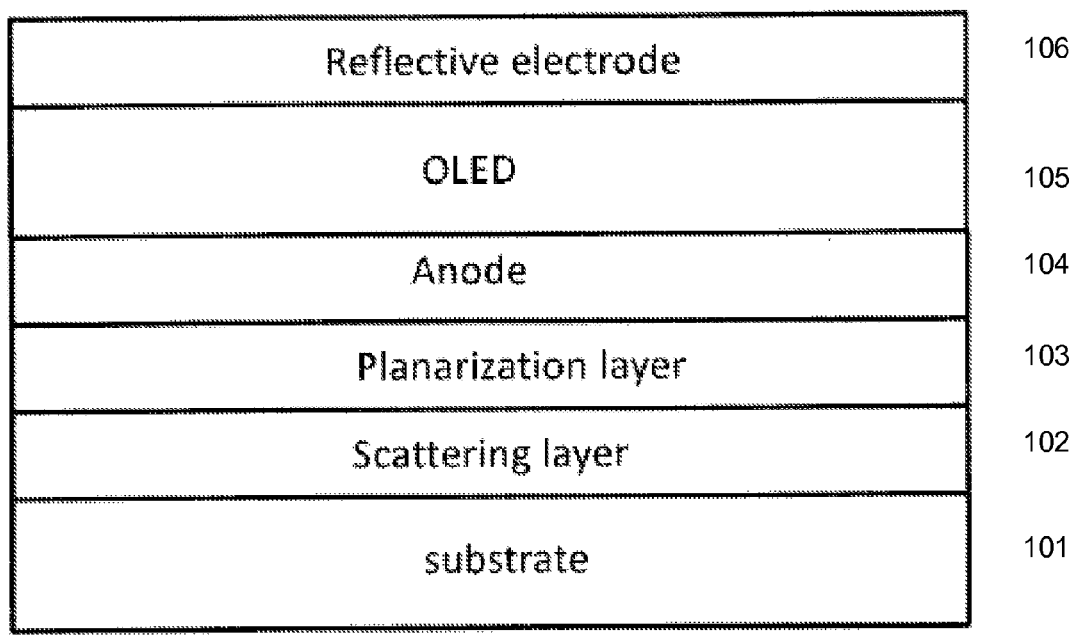
FIG. 5 shows an example OLED having a scattering layer and a planarization layer according to certain embodiments of the invention.

The same material can be used to make high index planarization layers by using particles with sizes much smaller than the wavelength of visible light. This can be important when, for example, the surface of the scattering layer is not smooth. FIG. 5 shows an OLED 100 that includes both a scattering layer 102 and a planarization layer 103. This device can be made by (a) producing the scattering material in solution and the high index planarization material, (b) coating the scattering material onto the substrate 101 and curing to form a scattering layer 102 on the substrate 101, (c) coating the high index planarization material onto the scattering layer 102 to form a planarization layer 103 on the scattering layer 102, (d) building the OLED device on top of the scattering layer, where the OLED device includes an anode 104, a light emitting structure 105, and a reflective electrode 106. In FIG. 4 and FIG. 5, conventional bottom emission OLEDs are used as examples. The invention can be applied to other OLED structures too, e.g. transparent and top emission OLEDs.

In some embodiments, the scattering layer can be applied to the opposite side of the substrate with an OLED device to extract waveguided light.

Figure 6:
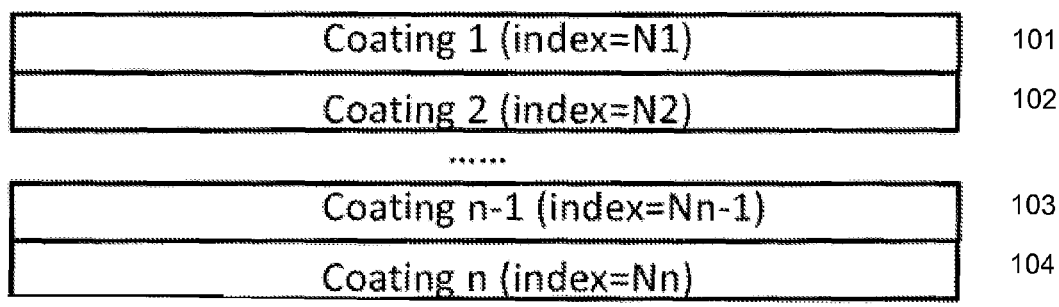
FIG. 6 shows a multi-layer coating where each layer has a varying refractive index.

This system allows the making of coatings having different refractive indices by tuning the particle concentration and the spacing between particles. This allows for the making of systems with varying refractive indices, such as graded index materials. FIG. 6 shows a structure 100 having multiple coatings (i.e., n coatings) of different refractive indices. FIG. 6 shows the first two coating layers 101, 102, and the final two coating layers 103, 104. In some embodiments, the first coating 101, for example, can be tuned to have a refractive index that matches that of indium tin oxide (ITO), while the final coating 104 can be tuned to have a refractive index that matches that of glass, where the intervening layers have refractive indices that decrease gradually with each successive layer. Such a graded index structure can be used in OLED or other optical devices. In this instance, the refractive indices of the various layers can be controlled by controlling the particle size and the polymer chain length.

A new type of light emitting device and methods of its fabrication are provided, where the light emitting device includes an optical layer that comprises metal oxide particles having a polymer covalently bonded to the particle surface.

In some embodiments, the invention provides a method of fabricating a light emitting device, comprising: depositing an optical layer comprising metal oxide particles having a polymer covalently bonded thereto; and depositing a light emitting layer, which is in optical communication with the optical layer. In some embodiments, the optical layer comprises a scattering layer. In some such embodiments, the scattering layer comprises scattering centers dispersed in a polymer matrix. In some such embodiments, the scattering centers comprise metal oxide particles.

The aforementioned metal oxide particles can be selected from any suitable metal oxide particles. In some embodiments, the metal oxide particles are selected from the group consisting of indium tin oxide (ITO), $SnO_2$, $Sb_2O_3$, $TiO_2$, $ZrO_2$, $Ta_2O_5$, $HfO_2$, $Nb_2O_3$, MgO, ZnO, and $In_2O_3$. In some further embodiments, the metal oxide particles are selected from the group consisting of $TiO_2$, $ZrO_2$, and $SnO_2$. In some embodiments, the metal oxide particles are $TiO_2$.

For embodiments where the optical layer comprises a scattering layer, the polymer matrix and the scattering centers can have any suitable index of refraction, as long as they are different relative to each other. In some embodiments, the difference in refractive indices between the polymer matrix and the scattering centers is greater than 0.1. In some further embodiments, the difference is greater than 0.3.

The scattering centers can have any suitable particle size, as long as the size is sufficient to scatter the emitted light. In some embodiments, the scattering centers have a particle size that ranges from $\lambda_{min}/4n$ to $4*\lambda_{max}/n$, wherein $\lambda_{min}$ is the minimum wavelength of light emitted by the light emitting layer, $\lambda_{max}$ is the maximum wavelength of light emitted by the light emitting layer, and n is the index of refraction of the optical layer. In some embodiments, the scattering centers have an average particle size of greater than 50 nm. In some embodiments, the scattering centers have an average particle size of less than 3000 nm.

In some embodiments, the optical layer includes metal oxide particles having an average particle size of less than 50 nm. In some such embodiments, the optical layer, including the scattering layer, comprises scattering centers having an average particle size of greater than 50 nm and metal oxide particles having an average particle size of less than 50 nm.

The optical layer can be deposited in any suitable manner. In some embodiments, the optical layer is deposited from a solution comprising: metal oxide particles having a polymer covalently bonded thereto, and a solvent in which the polymer is soluble. Any suitable deposition method may be used. In some embodiments, the optical layer is deposited via spin-coating, ink jet printing, knife-over-edge coating, slot-die coating, screen printing, or spray-coating.

The aforementioned embodiments include metal oxide particles having a polymer covalently bonded to the surface of the particle. The covalent attachment of the polymer to the metal oxide particle can be accomplished by any suitable means. In some embodiments, the metal oxide particles having a polymer covalently bonded thereto are formed by: covalently bonding an initiator to the metal oxide particles to form an initiator bound metal oxide particles; reacting the initiator bound metal oxide particles in solution with monomers, wherein the reaction is initiated by the initiator that is bound to the metal oxide particles. In some such embodiments, the initiator comprises an anchor group that that reacts with the metal oxide surface. In some such embodiments, the anchor group is selected from the group consisting of alkoxysilanes, chlorosilanes, catacols, and carboxylic acids. In some embodiments, the initiator comprises an initiating group that can function as a free radical polymerization initiator, a photo polymerization initiator, a cationic polymerization initiator, or an anionic polymerization initiator. In other embodiments, the initiator is selected from the group consisting of an azo compound, an organic peroxide, a bromoisobutyrate compound, a nitroxide compound, a benzodithiolate compound, an acetophenone, a benzil compound, a benzion compound, a benzophenone compound, and a thioxanthone. Any suitable monomers can be used in such embodiments. In some embodiments, the monomers are selected from the group consisting of ethylene, vinyl chloride, styrene, acrylonitrile, acrylate, methyl methacrylate, vinyl acetate, and derivatives thereof.

Alternative means of attaching the polymer to the metal oxide particle can be used. In some embodiments, the metal oxide particles having a polymer covalently bonded thereto are formed by: forming polymers that comprise reactive groups; and reacting the polymers in solution with the metal oxide particles, wherein the metal oxide particles have organic compounds bound to their surface and the reactive groups of the polymers react with the organic compounds to covalently bind the polymers to the metal oxide particles. In some embodiments, the reaction between the polymer and the organic compound comprises the use of click chemistry. Any suitable polymer can be used. In some embodiments, the polymer is selected from the group consisting of polystyenes, polyarylates, polymethacrylates, polyesters, polyamides, polycarbonates, and polyurethanes.

Other alternative means of attaching the polymer to the metal oxide particle can be used. In some embodiments, the metal oxide particles having a polymer covalently bonded thereto are formed by: reacting the metal oxide particles in solution with polymers, where the polymers comprise a reactive group that reacts with the metal oxide surface to bind the polymers to the metal oxide particles. Any suitable reactive group can be employed. In some embodiments, the reactive groups are selected from the group consisting of chlorosilanes, alkoxysilanes, catacols, and carboxylic acids. Also, any suitable polymer can be employed. In some embodiments, the polymer is selected from the group consisting of polystyenes, polyarylates, polymethacrylates, polyesters, polyamides, polycarbonates, and polyurethanes.

The invention is not limited to any particular light emitting device. In some embodiments, the light emitting device is an organic light emitting device. In some embodiments, the light emitting device comprises the following layers deposited in order over a substrate: an optical layer; a first electrode; a light emitting layer comprising a small molecule (e.g., having a molecular weight up to 2500 Da) light emitting material; and a second electrode; wherein the first electrode is at least partially transparent. In some embodiments, the small molecule is an organometallic complex. In such embodiments, the device can comprise other layers. For example, in some embodiments, the light emitting device further comprises a planarization layer deposited after depositing the optical layer and before depositing the first electrode. In some embodiments, a barrier layer is deposited after depositing the second electrode and before depositing the optical layer. In some other embodiments, the first electrode is deposited directly on the optical layer.

In embodiments that include a planarization layer, the optical layer and the planarization layer can have any suitable refractive indices. In some embodiments, the optical layer and the planarization layer have refractive indices that are substantially the same. For example, in some embodiments, the refractive index of the optical layer is within 5%, or within 10%, or within 15%, of the refractive index of the planarization layer.

The planarization can have any suitable structure. In some embodiments, the planarization layer comprises a composite that includes a polymer and particles. In such embodiments, the polymer and the particle can have any suitable optical features. In some embodiments, the planarization layer is composed of: a polymer having a first refractive index and a first volume share; and particles having a second refractive index and a second volume share; and wherein the refractive index of the planarization layer is within 10% of the sum of the first refractive index multiplied by the first volume share and the second refractive index multiplied by the second volume share. In some other embodiments, the planarization layer is composed of: a polymer having a first refractive index, a first weight share, a first density, wherein a first ratio is defined by the first weight share divided by the first density; and particles having a second refractive index, a second weight share, a second density, wherein a second ratio is defined by the second weight share divided by the second density; wherein the refractive index of the planarization layer multiplied by the sum of the first ratio and the second ratio is within 10% of the sum of the first refractive index multiplied by the first ratio and the second refractive index multiplied by the second ratio.

The planarization layer can be made of any suitable materials, including composite materials, such as polymeric composites. In some embodiments, the optical layer consists essentially of a first material, and the planarization layer consists essentially of the first material. In some such embodiments, the first material is a polymeric composite, for example, that includes a polymer matrix and particles, such as metal oxide particles. In embodiments where the optical layer and the planarization layer both include particles, the particles can have any suitable size or size distribution. In some such embodiments, the optical layer comprises a first set of particles; and the planarization layer comprises a second set of particles; wherein the average particle size of the first set of particles is greater than 50 nm, and the average particle size of the second set of particles is less than 50 nm.

Alternative embodiments of light emitting devices are also included. For example, in some embodiments, the light emitting device includes the following layers deposited in order over a substrate: a first electrode; a light emitting layer comprising a small molecule light emitting material; and a second electrode; and an optical layer; wherein the second electrode is at least partially transparent. Such light emitting devices can include further layers.

In light emitting devices of the invention, the optical layer can be deposited by any suitable means. In some embodiments, depositing the optical layer comprises: depositing a first sublayer having metal oxide particles having a first average volume concentration ratio of the metal oxide particles; and depositing a second sublayer having metal oxide particles having a second average volume concentration ratio of the metal oxide particles; and wherein the first average volume concentration ratio and the second average volume concentration ratio are different. In some other embodiments, depositing the optical layer comprises: depositing a first sublayer having metal oxide particles having a first average particle size and polymer chains having a first average polymer length; and depositing a second sublayer having metal oxide particles having a second average particle size and polymer chains having a second average polymer length; and wherein at least one of the following is different: the first average particle size and the second average particle size; or the first average polymer length and the second average polymer length. In some even further embodiments, depositing the optical layer comprises: depositing a first sublayer having metal oxide particles having a first average particle size and polymer chains having a first average polymer length; and depositing a second sublayer having metal oxide particles having a second average particle size and polymer chains having a second average polymer length; and depositing a third sublayer having metal oxide particles having a third average particle size and polymer chains having a third average polymer length; wherein each sublayer has at least one of an average particle size or an average polymer length that is different from that of its adjacent sublayers. In some such embodiments, the first sublayer has an average particle size of 300 nm, the second sublayer has an average particle size of 250 nm, and the third sublayer has an average particle size of 200 nm.

In some alternative embodiments, the light emitting device comprises an optical layer comprising metal oxide particles having a polymer covalently bonded thereto; and a light emitting layer, which is in optical communication with the optical layer. In some such embodiments, the optical layer comprises a first sublayer, a second sublayer, and a third sublayer, wherein each of the sublayers has a refractive index that is different from that of its adjacent sublayers.

In some further alternative embodiments, the invention includes a light emitting device fabricated by the process of: depositing an optical layer comprising metal oxide particles having a polymer covalently bonded thereto; and depositing a light emitting layer, which is in optical communication with the optical layer.

In some embodiments, the light emitting device is an organic light emitting device. In addition to the features described above, such devices can include an anode, a cathode, and an organic emissive layer disposed between the anode and the cathode. The organic emissive layer may include a host and an emissive dopant, such as an emissive phosphorescent and/or fluorescent dopant.

In embodiments that employ emissive dopants, such dopants can be combined with a wide variety of other materials. For example, emissive dopants may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

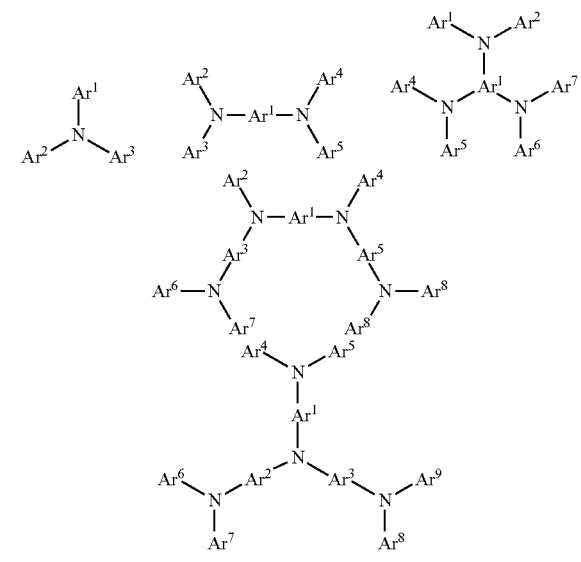

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

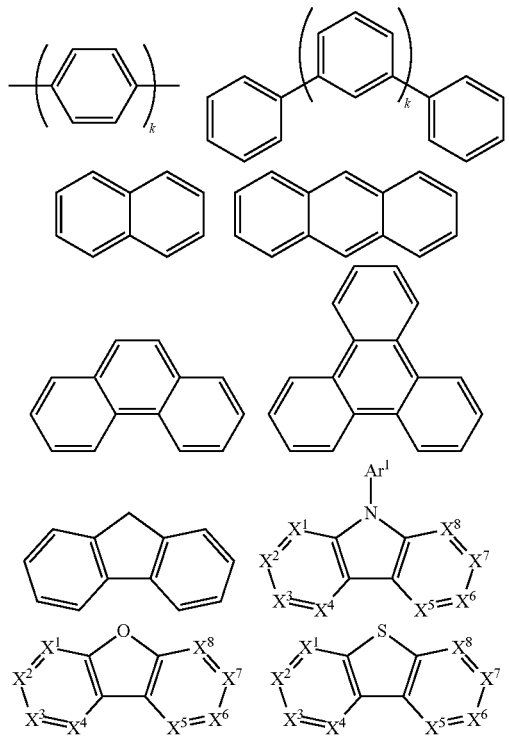

k is an integer from 1 to 20; $X^1$ to $X^8$ is C (including CH) or N; $Ar^1$ has the same group defined above.

Examples of metal complexes used in HIL or HTL include, but not limit to the following general formula:

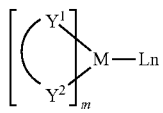

M is a metal, having an atomic weight greater than 40; $(Y^1-Y^2)$ is a bidentate ligand, $Y^1$ and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1-Y^2)$ is a 2-phenylpyridine derivative.

In another aspect, $(Y^1-Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

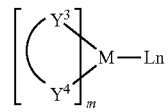

M is a metal; $(Y^3-Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

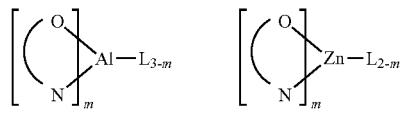

(O—N) is a bidentate ligand, having metal coordinated to atoms O and N.

In another aspect, M is selected from Ir and Pt.

In a further aspect, $(Y^3-Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

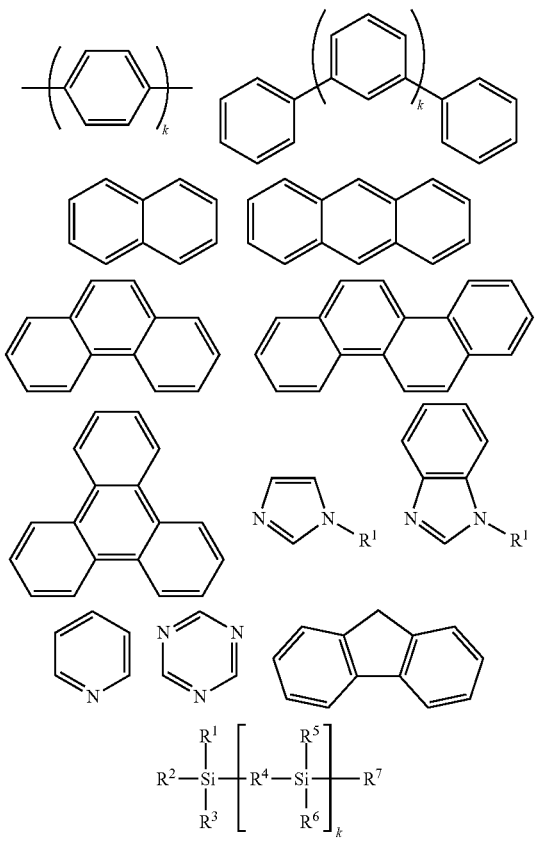
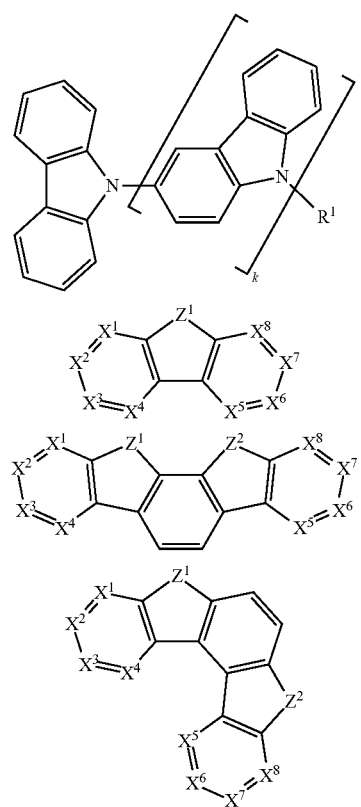
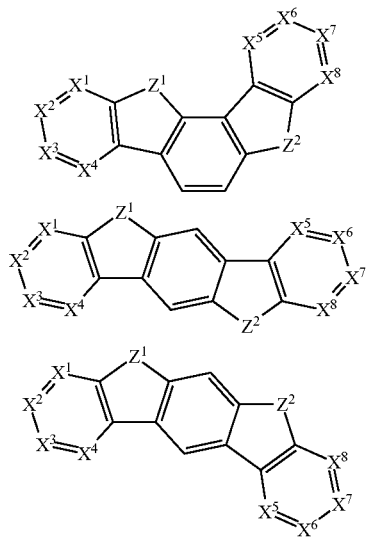

$R^1$ to $R^7$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 0 to 20.

$X^1$ to $X^8$ is selected from C (including CH) or N.

$Z^1$ and $Z^2$ is selected from $NR^1$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

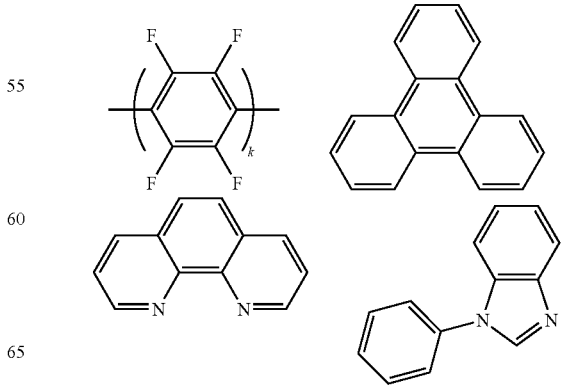

-continued

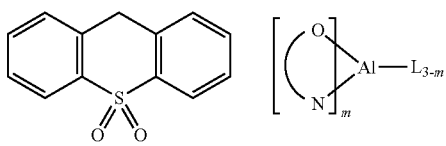

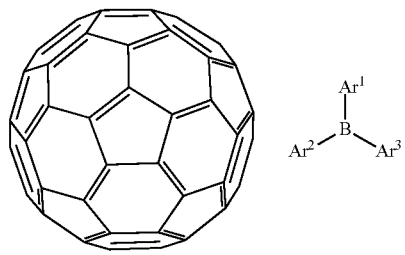

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

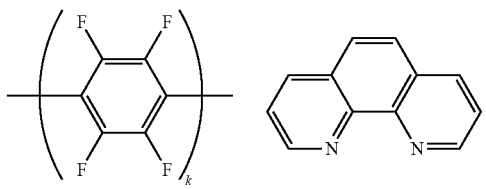

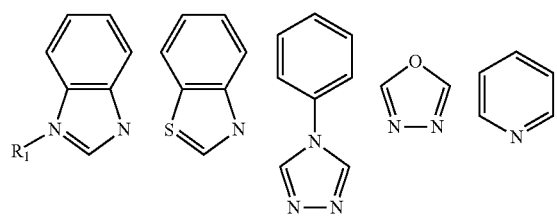

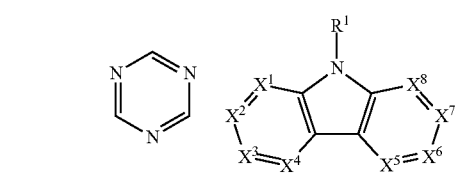

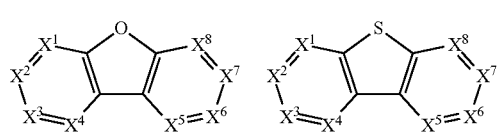

$R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from C (including CH) or N.

In another aspect, the metal complexes used in ETL contains, but not limit to the following general formula:

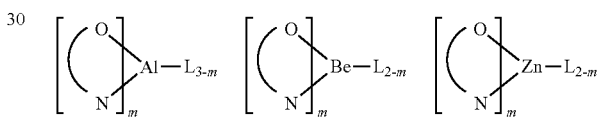

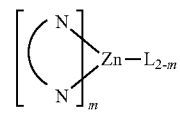

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
| --- | --- | --- |
| Hole injection materials | | |
| Phthalocyanine and porphryin compounds | | Appl. Phys. Lett. 69, 2160 (1996) |
| Starburst triarylamines | | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT: PSS, polyaniline, polypthiophene) | | Synth. Met. 87, 171 (1997) WO2007002683 |
| Phosphonic acid and sliane SAMs | | US20030162053 |

TABLE 1-continued
| MATERIAL | EXAMPLES OF MATERIAL | PUBLICATIONS |
|---|---|---|
| Triarylamine or polythiophene polymers with conductivity dopants | 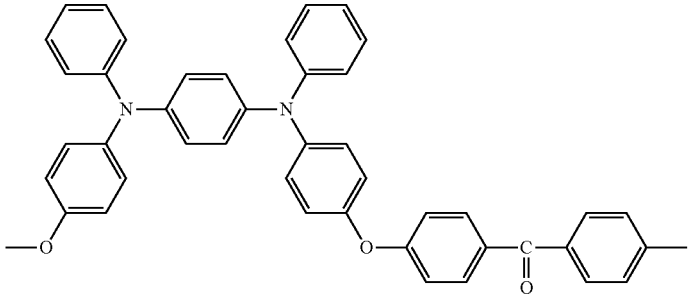 and 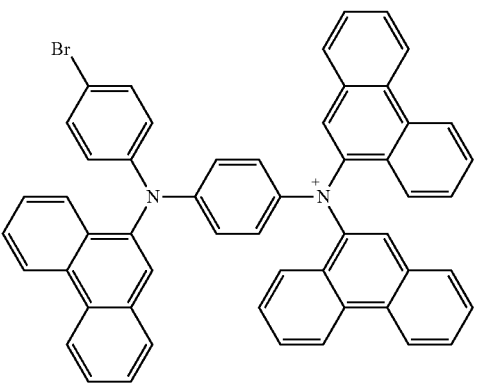 [SMILES: Brc1ccc(N(c2ccc(N(c3cc4ccccc4c4ccccc34)c3cc4ccccc4c4ccccc34)cc2)c2cc3ccccc3c3ccccc23)cc1]<br>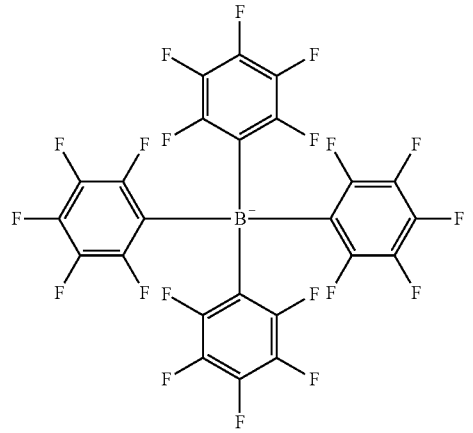 | EP1725079A1 |
| Organic compounds with conductive inorganic compounds, such as molybdenum and tungsten oxides | 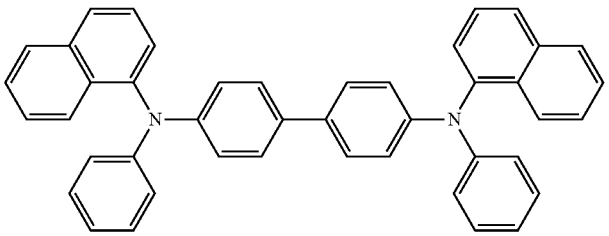 + $MoO_x$ | US20050123751<br>SID Symposium Digest, 37, 923 (2006)<br>WO2009018009 |

TABLE 1-continued

| MATERIAL | EXAMPLES OF MATERIAL | PUBLICATIONS |
| --- | --- | --- |
| n-type semiconducting organic complexes | | US20020158242 |
| Metal organometallic complexes | | US20060240279 |
| Cross-linkable compounds | | US20080220265 |
| Polythiophene based polymers and copolymers | | WO 2011075644<br>EP2350216 |

TABLE 1-continued
| MATERIAL | EXAMPLES OF MATERIAL | PUBLICATIONS |
|---|---|---|
| Hole transporting materials | | |
| Triarylamines (e.g., TPD, α-NPD) | 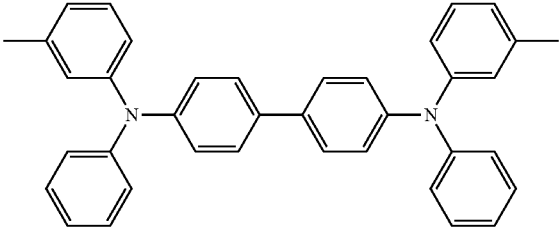 | Appl. Phys. Lett. 51, 913 (1987) |
| | 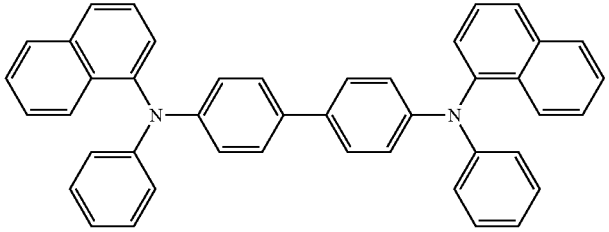 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 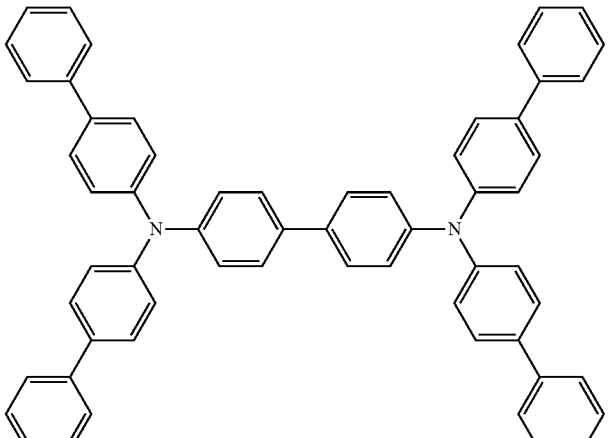 | EP650955 |
| | 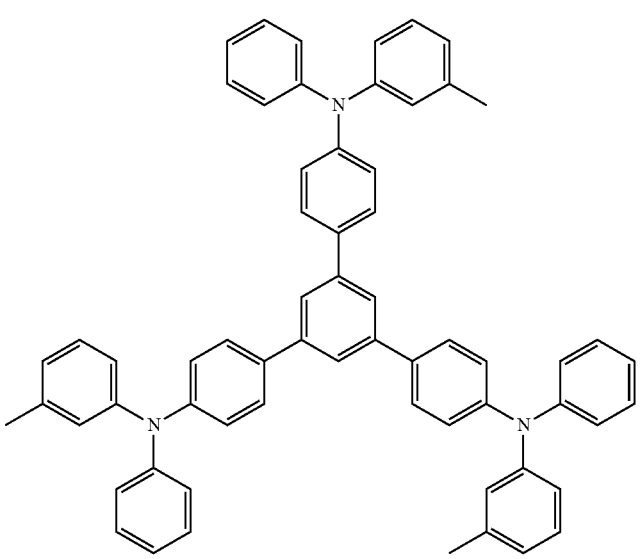 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 1-continued

| MATERIAL | EXAMPLES OF MATERIAL | PUBLICATIONS |
|---|---|---|
| | | Appl. Phys. Lett. 90, 183503 (2007) |
| | | Appl. Phys. Lett. 90, 183503 (2007) |
| Triaylamine on spirofluorene core | | Synth. Met. 91, 209 (1997) |
| Arylamine carbazole compounds | | Adv. Mater. 6, 677 (1994), US20080124572 |

TABLE 1-continued
| MATERIAL | EXAMPLES OF MATERIAL | PUBLICATIONS |
| --- | --- | --- |
| Triarylamine with (di)benzothiophene/ (di)benzofuran | 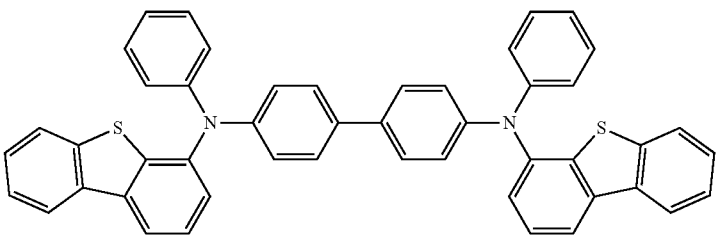 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 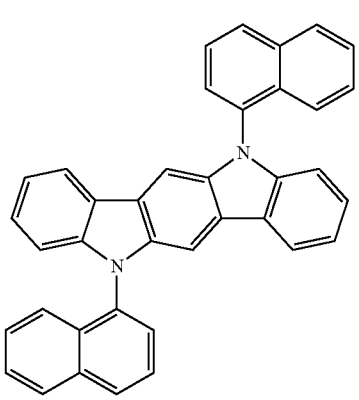 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 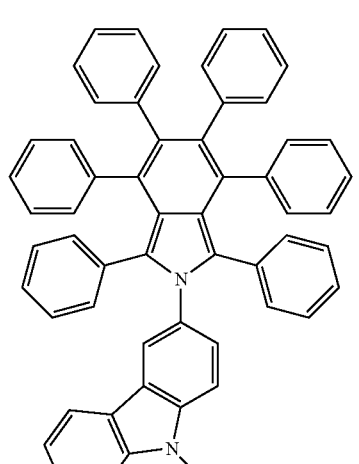 | Chem. Mater. 15, 3148 (2003) |
| Metal carbene complexes | 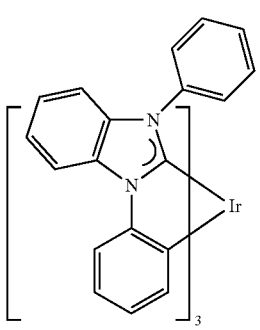 | US20080018221 |

TABLE 1-continued

| MATERIAL | EXAMPLES OF MATERIAL | PUBLICATIONS |
|---|---|---|
| Phosphorescent OLED host materials Red hosts | | |
| Arylcarbazoles | | Appl. Phys. Lett. 78, 1622 (2001) |
| Metal 8-hydroxy-quinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |

TABLE 1-continued
| MATERIAL | EXAMPLES OF MATERIAL | PUBLICATIONS |
|---|---|---|
| Aromatic fused rings | 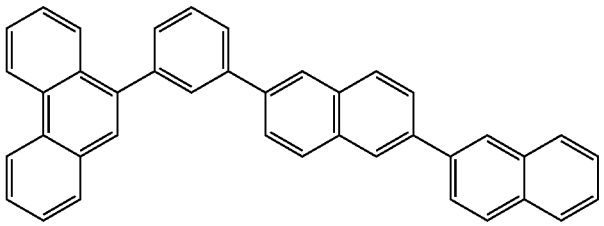 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 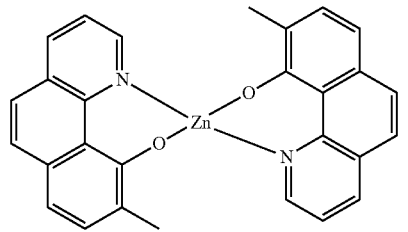 | WO2010056066 |
| Chrysene based compounds | 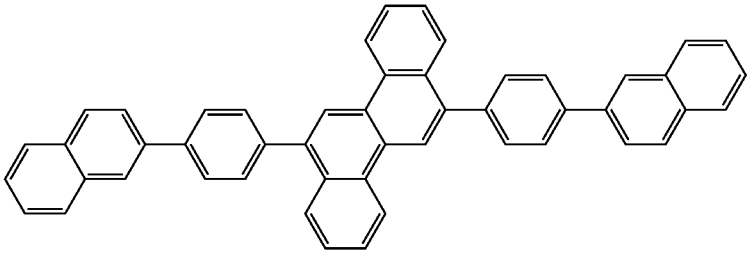 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| Green hosts | | |
| Arylcarbazoles | 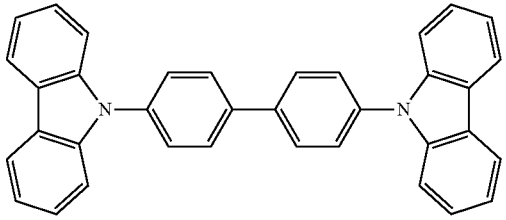 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 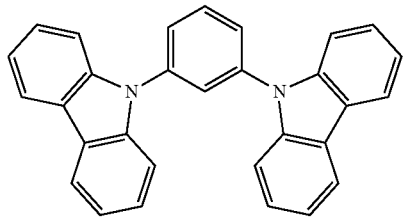 [SMILES: c1cc(-n2c3ccccc3c3ccccc32)cc(-n2c3ccccc3c3ccccc32)c1] | US20030175553 |
| | 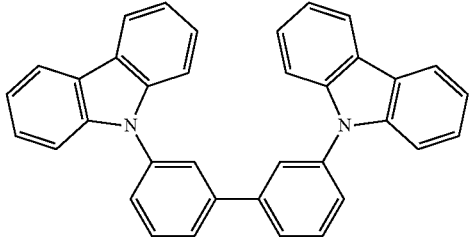 [SMILES: c1cc(-c2cccc(-n3c4ccccc4c4ccccc43)c2)cc(-n2c3ccccc3c3ccccc32)c1] | WO2001039234 |

TABLE 1-continued
| MATERIAL | EXAMPLES OF MATERIAL | PUBLICATIONS |
|---|---|---|
| Aryltriphenylene compounds | 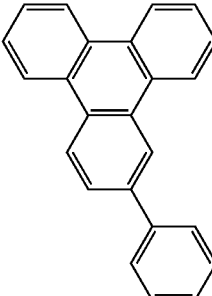 | US20060280965 |
| | 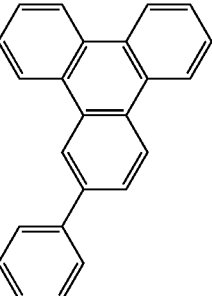 | US20060280965 |
| | 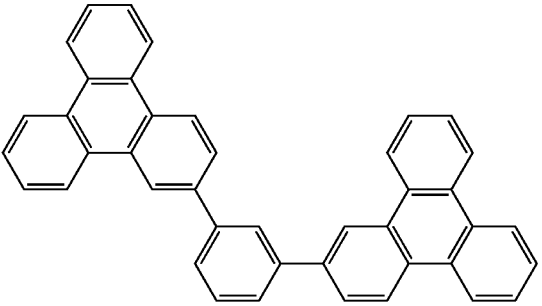 [SMILES: c1cc(-c2ccc3c4ccccc4c4ccccc4c3c2)cc(-c2ccc3c4ccccc4c4ccccc4c3c2)c1] | WO2009021126 |
| Poly-fused heteroaryl compounds | 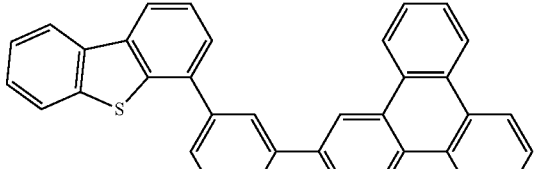 | US20090309488<br>US20090302743<br>US20100012931 |
| Donor acceptor type molecules | 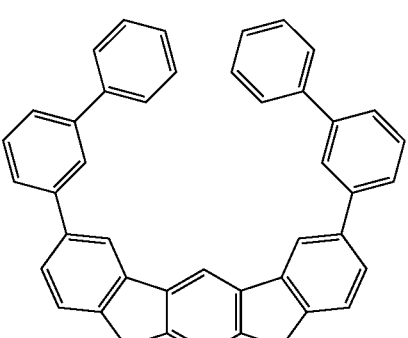 | WO2008056746 |

TABLE 1-continued
| MATERIAL | EXAMPLES OF MATERIAL | PUBLICATIONS |
|---|---|---|
| | 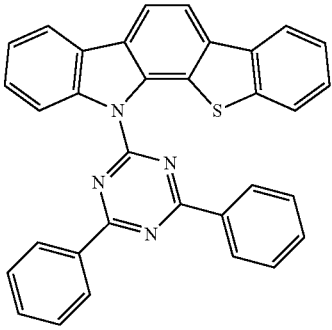 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 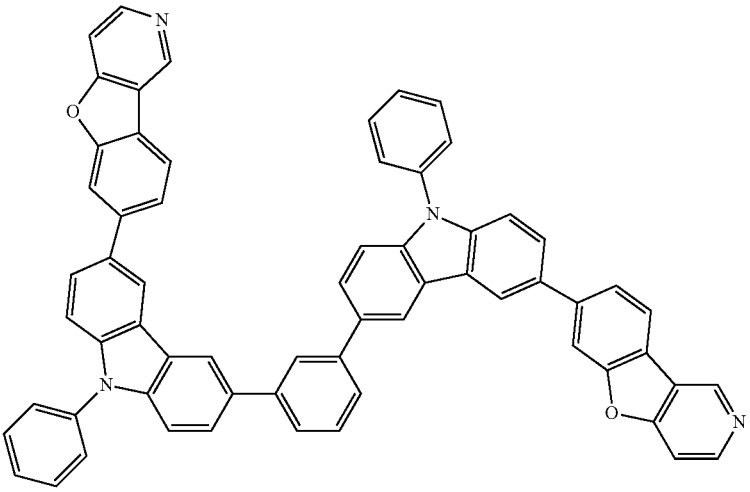 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 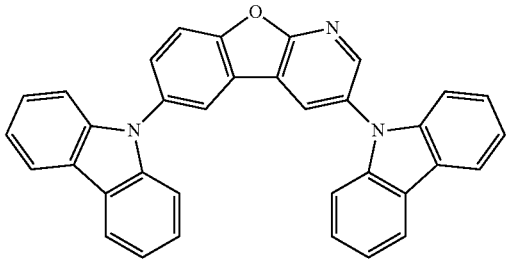 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 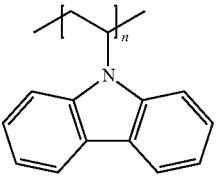 | Appl. Phys. Lett. 77, 2280 (2000) |
| Spirofluorene compounds | 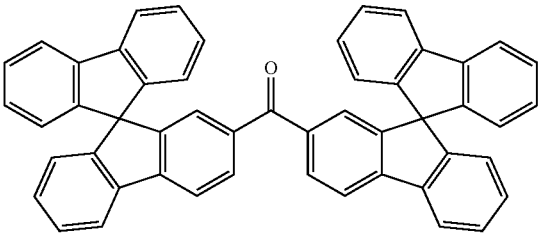 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE 1-continued

| MATERIAL | EXAMPLES OF MATERIAL | PUBLICATIONS |
|---|---|---|
| Metal phenoxybenzooxazole compounds | | WO2005089025 |
| | | WO2006132173 |
| | | JP200511610 |
| Spirofluorene-carbazole compounds | | JP2007254297 |
| | | JP2007254297 |

TABLE 1-continued

| MATERIAL | EXAMPLES OF MATERIAL | PUBLICATIONS |
| --- | --- | --- |
| Indolocabazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |

TABLE 1-continued

| MATERIAL | EXAMPLES OF MATERIAL | PUBLICATIONS |
| --- | --- | --- |
| Metal phenoxy-pyridine compounds | | WO2005030900 |
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
| | | US20070190359 |
| Dibenzothiophene/ Dibenzofuran-carbazole compounds | | WO2006114966, US20090167162 |
| | | US20090167162 |

TABLE 1-continued
| MATERIAL | EXAMPLES OF MATERIAL | PUBLICATIONS |
|---|---|---|
| | 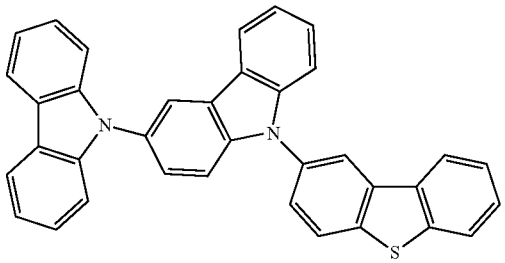 [SMILES: c1ccc2c(c1)sc1ccc(-n3c4ccccc4c4cc(-n5c6ccccc6c6ccccc65)ccc43)cc12] | WO2009086028 |
| | 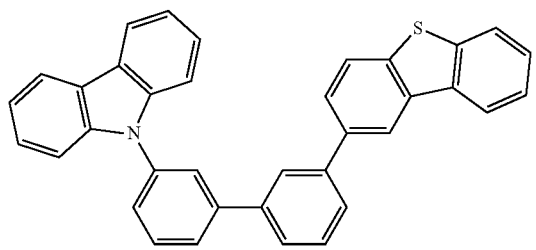 [SMILES: c1cc(-c2cccc(-n3c4ccccc4c4ccccc43)c2)cc(-c2ccc3sc4ccccc4c3c2)c1] | US20090030202, US20090017330 |
| | 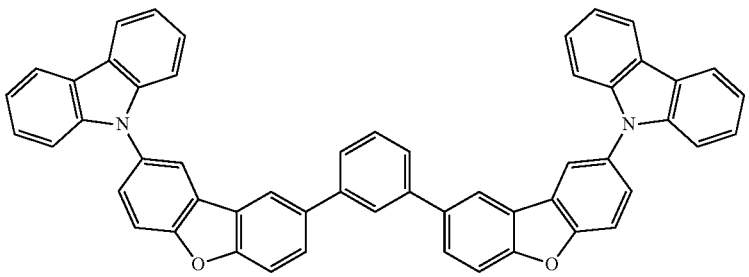 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 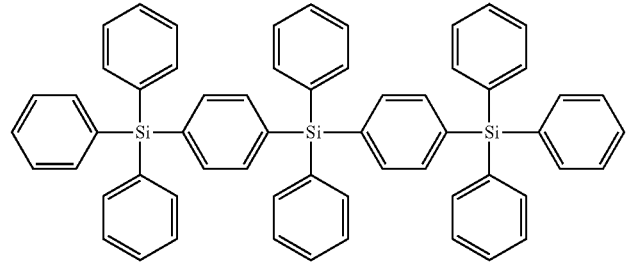 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 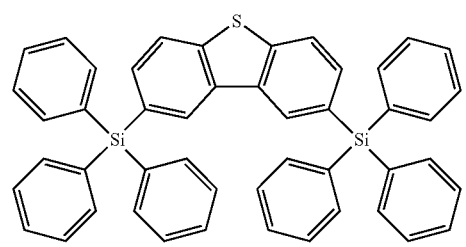 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| Carbazole linked by non-conjugated groups | | US20040115476 |
| Aza-carbazoles | | US20060121308 |
| High triplet metal organometallic complex | | U.S. Pat. No. 7,154,114 |

TABLE 1-continued

| MATERIAL | EXAMPLES OF MATERIAL | PUBLICATIONS |
| --- | --- | --- |
| Phosphorescent dopants Red dopants | | |
| Heavy metal porphyrins (e.g., PtOEP) | | Nature 395, 151 (1998) |
| Iridium(III) organometallic complexes | | Appl. Phys. Lett. 78, 1622 (2001) |
| | | US2006835469 |
| | | US2006835469 |
| | | US20060202194 |

TABLE 1-continued

| MATERIAL | EXAMPLES OF MATERIAL | PUBLICATIONS |
|---|---|---|
| | | US20060202194 |
| | | US20070087321 |
| | | US20080261076<br>US20100090591 |
| | | US20070087321 |
| | | Adv. Mater. 19, 739 (2007) |

TABLE 1-continued

| MATERIAL | EXAMPLES OF MATERIAL | PUBLICATIONS |
| --- | --- | --- |
| | | WO2009100991 |
| | | WO2008101842 |
| | | U.S. Pat. No. 7,232,618 |
| Platinum(II) organometallic complexes | | WO2003040257 |
| | | US20070103060 |

TABLE 1-continued

| MATERIAL | EXAMPLES OF MATERIAL | PUBLICATIONS |
| --- | --- | --- |
| Osminum(III) complexes | | Chem. Mater. 17, 3532 (2005) |
| Ruthenium(II) complexes | | Adv. Mater. 17, 1059 (2005) |
| Rhenium (I), (II), and (III) complexes | | US20050244673 |
| Green dopants | | |
| Iridium(III) organometallic complexes | and its derivatives | Inorg. Chem. 40, 1704 (2001) |
| | | US20020034656 |

TABLE 1-continued

| MATERIAL | EXAMPLES OF MATERIAL | PUBLICATIONS |
|---|---|---|
| | | U.S. Pat. No. 7,332,232 |
| | | US20090108737 |
| | | WO2010028151 |

TABLE 1-continued

| MATERIAL | EXAMPLES OF MATERIAL | PUBLICATIONS |
| --- | --- | --- |
| | | EP1841834B |
| | | US20060127696 |
| | | US20090039776 |
| | | U.S. Pat. No. 6,921,915 |
| | | US20100244004 |

TABLE 1-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US 20060008670 JP2007123392 |
| | | WO2010086089, WO2011044988 |
| | | Adv. Mater. 16, 2003 (2004) |

TABLE 1-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| | | US20010015432 |
| | | US20100295032 |

TABLE 1-continued

| MATERIAL | EXAMPLES OF MATERIAL | PUBLICATIONS |
| --- | --- | --- |
| Monomer for polymeric metal organometallic compounds | | U.S. Pat. No. 7,250,226, U.S. Pat. No. 7,396,598 |
| Pt(II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |
| | | WO2002015645 |

TABLE 1-continued

| MATERIAL | EXAMPLES OF MATERIAL | PUBLICATIONS |
|---|---|---|
| | | US20060263635 |
| | | US20060182992<br>US20070103060 |
| Cu complexes | | WO2009000673 |
| | | US20070111026 |

TABLE 1-continued

| MATERIAL | EXAMPLES OF MATERIAL | PUBLICATIONS |
| --- | --- | --- |
| Gold complexes | | Chem. Commun. 2906 (2005) |
| Rhenium(III) complexes | | Inorg. Chem. 42, 1248 (2003) |
| Osmium(II) complexes | | U.S. Pat. No. 7,279,704 |
| Deuterated organometallic complexes | | US20030138657 |

TABLE 1-continued

| MATERIAL | EXAMPLES OF MATERIAL | PUBLICATIONS |
|---|---|---|
| Organometallic complexes with two or more metal centers | | US20030152802 |
| | | U.S. Pat. No. 7,090,928 |
| Blue dopants | | |
| Iridium(III) organometallic complexes | | WO2002002714 |
| | | WO2006009024 |
| | | US20060251923<br>US20110057559<br>US20110204333 |

TABLE 1-continued
| MATERIAL | EXAMPLES OF MATERIAL | PUBLICATIONS |
|---|---|---|
| | 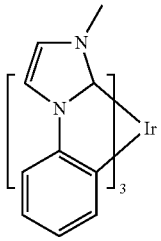 | U.S. Pat. No. 7,393,599, WO2006056418, US20050260441, WO2005019373 |
| | 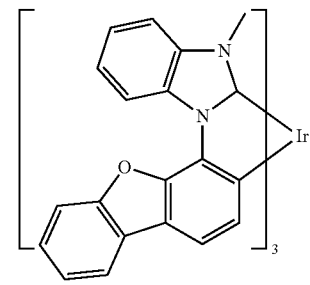 | U.S. Pat. No. 7,534,505 |
| | 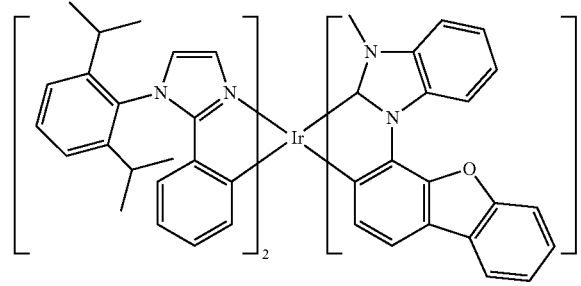 | WO2011051404 |
| | 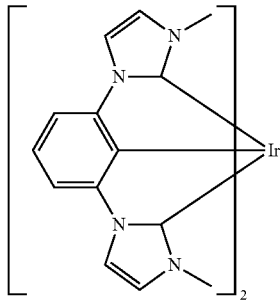 | U.S. Pat. No. 7,445,855 |
| | 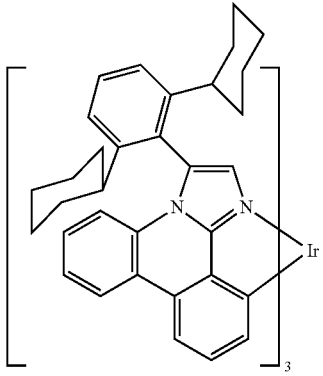 | US20070190359, US20080297033 US20100148663 |

TABLE 1-continued
| MATERIAL | EXAMPLES OF MATERIAL | PUBLICATIONS |
|---|---|---|
| | 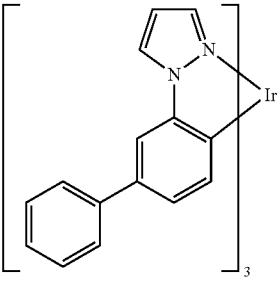 | U.S. Pat. No. 7,338,722 |
| | 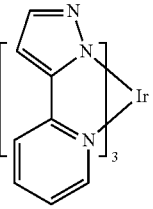 | US20020134984 |
| | 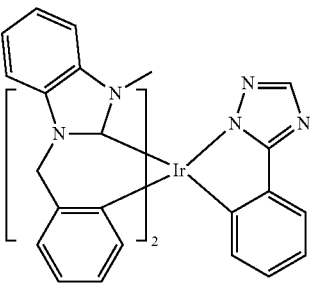 | Angew. Chem. Int. Ed. 47, 1 (2008) |
| | 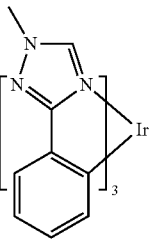 | Chem. Mater. 18, 5119 (2006) |
| | 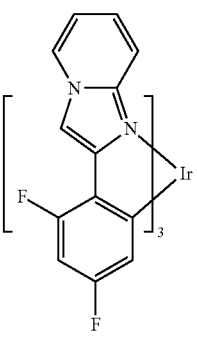 | Inorg. Chem. 46, 4308 (2007) |

TABLE 1-continued

| MATERIAL | EXAMPLES OF MATERIAL | PUBLICATIONS |
|---|---|---|
| | (structure) | WO2005123873 |
| | (structure) | WO2005123873 |
| | (structure) | WO2007004380 |
| | (structure) | WO2006082742 |
| Osmium(II) complexes | (structure) | U.S. Pat. No. 7,279,704 |

TABLE 1-continued

| MATERIAL | EXAMPLES OF MATERIAL | PUBLICATIONS |
| --- | --- | --- |
| | | Organometallics 23, 3745 (2004) |
| Gold complexes | | Appl. Phys. Lett. 74, 1361 (1999) |
| Platinum(II) complexes | | WO2006098120, WO2006103874 |
| Pt tetradentate complexes with at least one metal-carbene bond | | U.S. Pat. No. 7,655,323 |
| Exciton/hole blocking layer materials | | |
| Bathocuprine compounds (e.g., BCP, BPhen) | | Appl. Phys. Lett. 75, 4 (1999) |
| | | Appl. Phys. Lett. 79, 449 (2001) |
| Metal 8-hydroxy-quinolates (e.g., BAlq) | | Appl. Phys. Lett. 81, 162 (2002) |

TABLE 1-continued

| MATERIAL | EXAMPLES OF MATERIAL | PUBLICATIONS |
|---|---|---|
| 5-member ring electron deficient heterocycles such as triazole, oxadiazole, imidazole, benzoimidazole | | Appl. Phys. Lett. 81, 162 (2002) |
| Triphenylene compounds | | US20050025993 |
| Fluorinated aromatic compounds | | Appl. Phys. Lett. 79, 156 (2001) |

TABLE 1-continued

| MATERIAL | EXAMPLES OF MATERIAL | PUBLICATIONS |
|---|---|---|
| Phenothiazine-S-oxide | | WO2008132085 |
| Silylated five-membered nitrogen, oxygen, sulfur or phosphorus dibenzoheterocycles | | WO2010079051 |
| Aza-carbazoles | | US20060121308 |
| Electron transporting materials | | |
| Anthracene-benzoimidazole compounds | | WO2003060956 |
| | | US20090179554 |

TABLE 1-continued

| MATERIAL | EXAMPLES OF MATERIAL | PUBLICATIONS |
|---|---|---|
| Aza triphenylene derivatives | | US20090115316 |
| Anthracene-benzothiazole compounds | | Appl. Phys. Lett. 89, 063504 (2006) |
| Metal 8-hydroxy-quinolates (e.g., $Alq_3$, $Zrq_4$) | | Appl. Phys. Lett. 51, 913 (1987)<br>U.S. Pat. No. 7,230,107 |
| Metal hydroxybeno-quinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |

TABLE 1-continued
| MATERIAL | EXAMPLES OF MATERIAL | PUBLICATIONS |
|---|---|---|
| 5-member ring electron deficient heterocycles (e.g., triazole, oxadiazole, imidazole, benzoimidazole) | 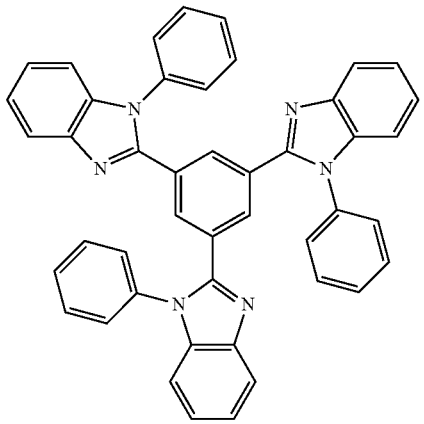 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
|  | 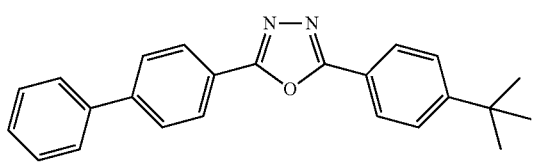 [SMILES: CC(C)(C)c1ccc(-c2nnc(-c3ccc(-c4ccccc4)cc3)o2)cc1] | Appl. Phys. Lett. 55, 1489 (1989) |
|  | 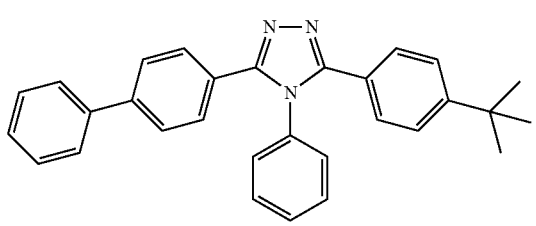 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 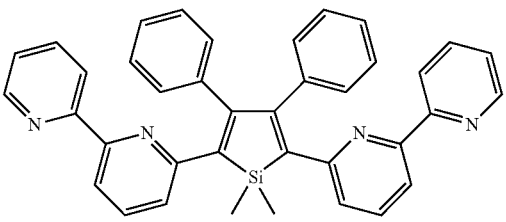 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 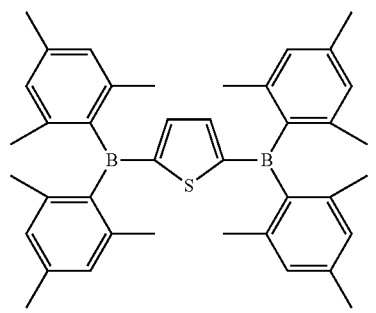 | J. Am. Chem. Soc. 120, 9714 (1998) |
| Fluorinated aromatic compounds | 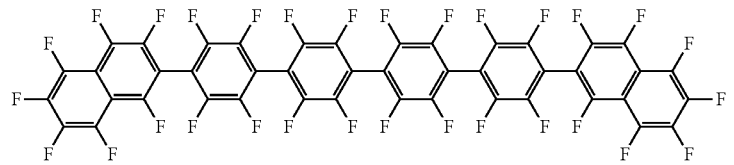 | J. Am. Chem. Soc. 122, 1832 (2000) |

TABLE 1-continued

| MATERIAL | EXAMPLES OF MATERIAL | PUBLICATIONS |
|---|---|---|
| Fullerene (e.g., C60) | 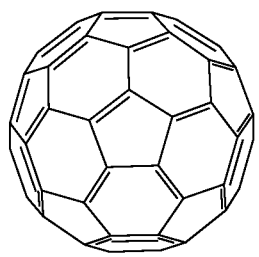 | US20090101870 |
| Triazine complexes | 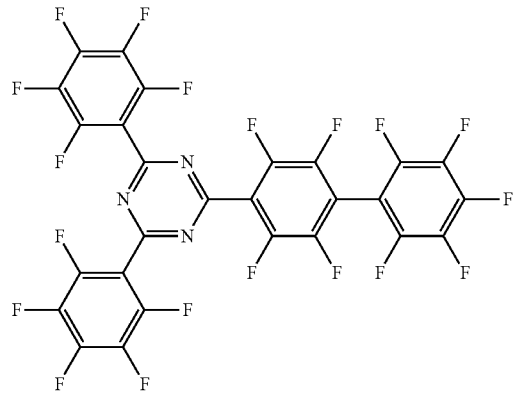 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 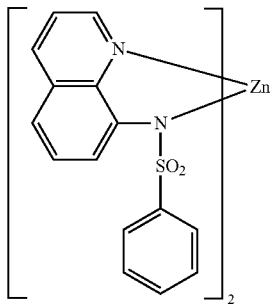 | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method of fabricating a light emitting device, comprising:
   depositing an optical layer comprising metal oxide particles having a polymer covalently bonded thereto; and
   depositing a light emitting layer, which is in optical communication with the optical layer.

2. The method of claim 1, wherein the optical layer comprises a scattering layer.

3. The method of claim 2, wherein the scattering layer comprises scattering centers dispersed in a polymer matrix.

4. The method of claim 3, wherein the scattering centers comprise metal oxide particles.

5. The method of claim 4, wherein metal oxide particles are selected from the group consisting of indium tin oxide (ITO), $SnO_2$, $Sb_2O_3$, $TiO_2$, $ZrO_2$, $Ta_2O_5$, $HfO_2$, $Nb_2O_3$, MgO, ZnO, and $In_2O_3$.

6. The method of claim 4, wherein metal oxide particles are selected from the group consisting of $TiO_2$, $ZrO_2$, and $SnO_2$.

7. The method of claim 3, wherein the scattering centers have a particle size that ranges from $\lambda min/4n$ to $4*\lambda max/n$, wherein $\lambda min$ is the minimum wavelength of light emitted by the light emitting layer, $\lambda max$ is the maximum wavelength of light emitted by the light emitting layer, and n is the index of refraction of the optical layer.

8. The method of claim 3, wherein the scattering centers comprise a first set of scattering centers and a second set of scattering centers, wherein the scattering centers in the first set of scattering centers have an average particle size of greater than 50 nm, and wherein the scattering centers in the second set of scattering centers have an average particle size of less than 50 nm.

9. The method of claim 1, wherein the optical layer is solution deposited from a solution comprising:
   metal oxide particles having a polymer covalently bonded thereto, and
   a solvent in which the polymer is soluble.

10. The method of claim 9, wherein the metal oxide particles having a polymer covalently bonded thereto are formed by:
  covalently bonding an initiator to the metal oxide particles to form an initiator bound metal oxide particles;
  reacting the initiator bound metal oxide particles in solution with monomers, wherein the reaction is initiated by the initiator that is bound to the metal oxide particles.

11. The method of claim 9, wherein the metal oxide particles having a polymer covalently bonded thereto are formed by:
  forming polymers that comprise reactive groups;
  reacting the polymers in solution with the metal oxide particles, wherein the metal oxide particles have organic compounds bound to their surface and the reactive groups of the polymers react with the organic compounds to covalently bind the polymers to the metal oxide particles.

12. The method of claim 1, wherein the method comprises depositing, in order over a substrate:
  the optical layer;
  a first electrode;
  a light emitting layer comprising a small molecule light emitting material; and
  a second electrode;
  wherein the first electrode is at least partially transparent.

13. The method of claim 12, wherein the method further comprises depositing a planarization layer after depositing the optical layer and before depositing the first electrode.

14. The method of claim 13, wherein the planarization layer is composed of:
  a polymer having a first refractive index and a first volume share; and
  particles having a second refractive index and a second volume share; and
  wherein the refractive index of the planarization layer is within 10% of the sum of the first refractive index multiplied by the first volume share and the second refractive index multiplied by the second volume share.

15. The method of claim 12, wherein the method further comprises depositing a barrier layer after depositing the second electrode and before depositing the optical layer.

16. A light emitting device, comprising:
  an optical layer comprising metal oxide particles having a polymer covalently bonded thereto; and
  a light emitting layer, which is in optical communication with the optical layer.

17. A light emitting device fabricated by the process of:
  depositing an optical layer comprising metal oxide particles having a polymer covalently bonded thereto;
  depositing a light emitting layer, which is in optical communication with the optical layer.

* * * * *